United States Patent [19]

Hirakawa et al.

[11] Patent Number: 5,652,466

[45] Date of Patent: Jul. 29, 1997

[54] PACKAGE FOR A SEMICONDUCTOR ELEMENT

[75] Inventors: Tetsuo Hirakawa; Kozo Matsukawa, both of Kokubu, Japan

[73] Assignee: Kyocera Corporation, Kyoto, Japan

[21] Appl. No.: 551,849

[22] Filed: Nov. 7, 1995

[30] Foreign Application Priority Data

Nov. 9, 1994 [JP] Japan .................................... 6-274876

[51] Int. Cl.⁶ ............................. H01L 23/98; H01L 23/34
[52] U.S. Cl. ............................. 257/772; 257/724; 257/693
[58] Field of Search ................................. 287/772, 691, 287/700, 723, 724, 693, 780

[56] References Cited

U.S. PATENT DOCUMENTS 2,623,273  12/1952  Murray et al. ............................ 257/772
5,237,204  8/1993  Val ............................................ 257/698

FOREIGN PATENT DOCUMENTS 4-107856  4/1992  Japan ....................................... 257/700

Primary Examiner—Mahshid D. Saadat
Assistant Examiner—Jhihan B. Clark
Attorney, Agent, or Firm—Loeb & Loeb LLP

[57] ABSTRACT

A package for housing a semiconductor element is provided which allows effective prevention of adverse effects of power supply noise on the semiconductor, and normal and steady operation of the semiconductor element over a long period of time. The package for housing a semiconductor element is assembled by forming connection pads, which are connected to the power supply electrode and the grounding electrode of the semiconductor element to be housed therein, on the outer surface of a container having a space for housing the semiconductor element therein and attaching electrodes of a capacitor element to the connection pads by means of a soldering material. The soldering material is formed of an alloy consisting of from 40.0 to 45.0% by weight of silver, from 5.0 to 45.0% by weight of indium, from 15.0 to 55.0% by weight of tin, and 10.0% or less by weight of copper.

3 Claims, 1 Drawing Sheet

5,652,466

PACKAGE FOR A SEMICONDUCTOR ELEMENT

BACKGROUND OF THE INVENTION

1. Field of the Invention

The present invention relates to a package for housing a semiconductor element and more particularly to a package for housing a semiconductor element which is designed to prevent adverse effects of power supply noise on the semiconductor element housed therein.

2. Description of the Related Art

A conventional package for housing a semiconductor element usually comprises an insulating substrate which is composed of aluminum oxide sinter and has a semiconductor element-mounting section for mounting a semiconductor element at a top surface thereof and metallized wiring layers composed of powder of a high-melting point metal such as tungsten, molybdenum or manganese which lead out at positions from the periphery of the semiconductor element-mounting section to the outer regions of the insulating substrate; outer lead terminals attached to the metallized wiring layers by means of a soldering material such as silver solder for establishing connections between the respective electrodes of the semiconductor element and exterior electrical circuits; and a lid. The package for housing a semiconductor element is fabricated as a semiconductor device product by securely bonding the semiconductor element to the semiconductor element-mounting section of the insulating substrate by means of an adhesive such as glass, resin or soldering material while electrically connecting the respective electrodes to the metallized wiring layers by means of bonding wires, and then hermetically sealing the semiconductor element inside a container composed of the insulating substrate and the lid.

Here, this type of conventional package for a semiconductor element is constructed in such a manner that connection pads, which are connected to the power supply electrode and the grounding electrode of the semiconductor element to be housed therein, are formed on the top surface of the insulating substrate, electrodes of a capacitor element comprising barium titanate porcelain as a dielectric substance are attached to the connection pads by means of a soldering material such as solder, with the capacitor element located at some point along the connection between the power supply electrode and the grounding electrode of the semiconductor element, thereby effectively preventing the adverse effects of power supply noise on the semiconductor element.

However, since the connection pads provided on the insulating substrate are attached to the capacitor element by means of a solder in this type of conventional package for housing a semiconductor element and the melting point of the solder is as low as approximately 180° C., the connection pads are detached from the capacitor element due to the heat of the fellow solder at as a high temperature as approximately 250° C. when the semiconductor element is hermetically housed inside the package to fabricate a semiconductor device which is then connected to a wiring conductor of an exterior electrical circuit board by means of fellow solder. As a result, the package has a drawback in that the semiconductor element housed inside the package cannot be protected against the power supply noise and thus the semiconductor element cannot be operated under steady and normal conditions.

As a solution to overcome the drawback, it may be proposed to attach the capacitor element to the connection pads of the container by means of a high-melting point soldering material.

In cases where the soldering material for attaching the electrodes of the capacitor element to the connection pads of the container has a high melting point, there is presented a drawback in that the dielectric surface of the capacitor element is reduced to a metal by the heat applied when the electrodes of the capacitor element are attached to the connection pads of the container, and this causes a change in the capacity of the capacitor element and formation of a short circuit between the electrodes of the capacitor element, thereby making it impossible for the capacitor element to completely prevent the adverse effects of power supply noise on the semiconductor element for steady and normal operation of the semiconductor element over a long period of time.

SUMMARY OF THE INVENTION

The present invention, having been accomplished in consideration of the above-described drawbacks, is aimed at providing a package for housing a semiconductor element which is designed so as to effectively prevent the adverse effects of power supply noise on the semiconductor element and to allow normal and steady operation of the semiconductor element for a long period of time.

In one aspect of the present invention, the package for housing a semiconductor element, which is assembled by forming connection pads which are connected to the power supply electrode and the grounding electrode of the semiconductor element to be housed therein, on the outer surface of a container having a space for housing a semiconductor element therein, and attaching the electrodes of a capacitor element to the connection pads by means of a soldering material, is characterized in that the melting temperature of the soldering material is within a range of 300°–500° C.

In another aspect of the present invention, the package for housing a semiconductor element, which is assembled by forming connection pads which are connected to the power supply electrode and the grounding electrode of the semiconductor element to be housed in the inside, on the outer surface of a container having a space for housing the semiconductor element therein, and attaching the electrodes of a capacitor element to the connection pads by means of a soldering material, is characterized in that the soldering material is formed of an alloy consisting of from 40.0 to 45.0% by weight of silver, from 5.0 to 45.0% by weight of indium, from 15.0 to 55.0% by weight of tin and 10.0% or less by weight of copper.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
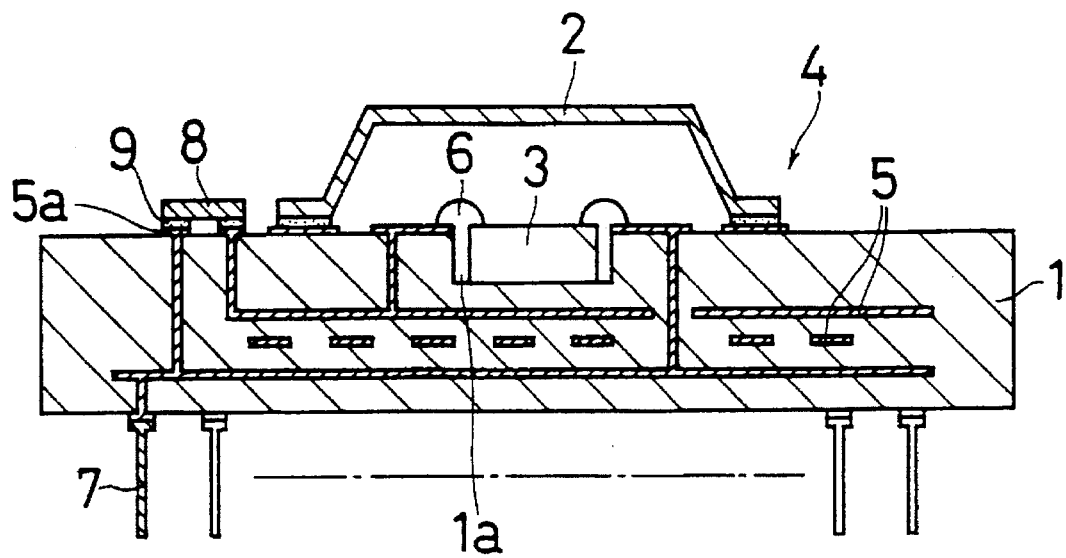
FIG. 1 is a sectional view illustrative of an embodiment of the package for housing a semiconductor element according to the present invention.

Now referring to the drawings, preferred embodiments of the invention are described below.

The present invention will now be explained in detail with reference to the accompanying drawings.

Figure 2:
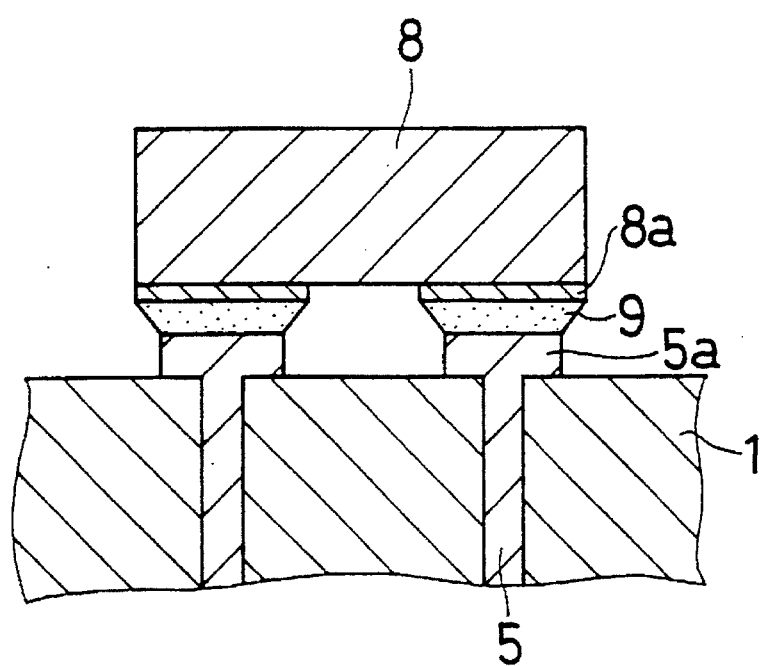
FIG. 2 is an expanded sectional view of the main portions of the package for a semiconductor element illustrated in FIG. 1.

FIG. 1 and FIG. 2 show an embodiment of the package for housing a semiconductor element according to the present invention, wherein 1 indicates an insulating substrate and 2 indicates a lid. These insulating substrate 1 and lid 2 constitute a container 4 for housing a semiconductor element 3.

The insulating substrate 1 is composed of an electric insulating material such as aluminum oxide sinter, mullite sinter, silicon carbide sinter or aluminum nitride sinter, with a semiconductor element-mounting section 1a at a top surface thereof and with the semiconductor element 3 bonded securely onto the semiconductor element-mounting section 1a by means of an adhesive such as glass, resin or soldering material.

The insulating substrate 1 composed of aluminum oxide sinter as described above is prepared by adding an appropriate organic dispersant or solvent to powder of a starting material such as alumina ($Al_2O_3$), silica ($SiO_2$), calcia (CaO) or magnesia (MgO), while mixing to prepare a slurry, subjecting the slurry to long well-known doctor coating (doctor blade method), roll-calendering or the like to provide green ceramic sheets (raw ceramic sheets), appropriately stamping and laminating a plurality of the green ceramic sheets and firing the resulting laminate at an elevated temperature (approximately 1,600° C.).

The insulating substrate 1 has a plurality of metallized wiring layers 5 arranged from the periphery of the semiconductor element-mounting section 1a to the bottom surface of the insulating substrate 1, the respective electrodes (power supply electrode, grounding electrode, signal electrode) of the semiconductor element 3 are electrically connected to the sections of the metallized wiring layers which are close to the periphery of the semiconductor element-mounting section 1a, by means of bonding wires 6, and an outer lead terminal 7, which is connected to an exterior electrical circuit, is attached to the section of each metallized wiring layer 5 leading out through the bottom surface of the insulating substrate 1, by means of a soldering material such as silver solder.

The metallized wiring layers 5, which are composed of powder of a high-melting point metal such as tungsten, molybdenum or manganese, are formed from the periphery of the semiconductor element-mounting section 1a to the bottom surface of the insulating substrate 1 by printing, in advance, a coating of a metal paste prepared by addition of an appropriate organic dispersant or solvent to powder of the high-melting point metal, e.g., tungsten, while mixing, on green ceramic sheets which are to be fabricated into the insulating substrate 1, in a designated pattern by long well-known screen printing.

Here, 1.0–20.0 μm thick plating of the exposed surfaces of the metallized wiring layer 5 with a metal such as nickel or gold, which is highly resistant to corrosion and has excellent wettability with the soldering material used, allows both effective prevention of oxidative corrosion of the metallized wiring layers 5 and secures connection between the metallized wiring layers 5 and the bonding wires 6 as well as secures attachment of the outer lead terminals 7 to the metallized wiring layers 5. Accordingly, it is desired to plate the exposed surfaces of the metallized wiring layers 5 with a 1.0–20.0 μm thick layer of nickel, gold or the like in order to prevent oxidative corrosion of the metallized wiring layers 5 and to ensure attachment of the metallized wiring layers 5 to the bonding wires 6 and the outer lead terminals 7.

The outer lead terminals 7 to be attached to the metallized wiring layers 5 by means of a soldering material such as silver solder are composed of a metal material such as iron-nickel-cobalt alloy or iron-nickel alloy, and the respective electrodes of the semiconductor element 3 to be mounted on the semiconductor-mounting section 1a of the insulating substrate 1 are electrically connected to exterior electrical circuits via the metallized wiring layers 5 and the outer lead terminals 7.

The outer lead terminals 7 are formed into a designated shape by subjecting ingot (a mass of metal) of iron-nickel-cobalt alloy or the like to a long well-known metal-processing method, such as calendering, stamping, etc.

In addition, 1.0–20.0 μm thick plating of the exposed surfaces of the outer lead terminal 7 with a metal such as nickel or gold, which is highly resistant to corrosion and has excellent wettability with the soldering material used, allows both effective prevention of oxidative corrosion of the outer lead terminals 7 and secure attachment of the outer lead terminals 7 to the exterior electrical circuits by means of a soldering material such as solder. Accordingly, it is desired to coat the exposed surfaces of the outer lead terminals 7 with 1.0–20.0 μm thick layers of nickel, gold or the like.

Formed on the top surface of the insulating substrate 1 are connection pads 5a which are connected to the power supply electrode and the grounding electrode of the semiconductor element 3 to be housed therein, electrodes 8a of a capacitor element 8 being attached to the connection pads 5a.

The connection pads 5a serve as foundation members for attachment of the capacitor element 8 to the top surface of the insulating substrate 1 and further serve to locate the capacitor element 8 at some point along the connection between the power supply electrode and the grounding electrode of the semiconductor element 3, and they are formed of powder of a high-melting point metal such as tungsten, molybdenum or manganese.

The connection pads 5a are formed on the top surface of the insulating substrate 1 into a designated shape in the same manner as for the metallized wiring layers 5.

The capacitor element 8 to be attached to the connection pads 5a is formed by, for example, burying many counter electrodes in barium titanate porcelain, and the capacitor element 8 works to eliminate power supply noise which results from fluctuation in the voltage of the supplied power and may cause malfunction of the semiconductor element 3, thereby allowing protection of the semiconductor element 3 from the adverse effects of power supply noise to ensure normal and steady operation over a long period of time.

In addition, since the soldering material used to attach the electrodes 8a of the capacitor element 8 to the connection pads 5a consists of from 40.0 to 45.0% by weight of silver, from 5.0 to 45.0% by weight of indium, from 15.0 to 55.0% by weight of tin and 10.0% or less by weight of copper and thus has a melting temperature of 300°–500° C., there is no risk of the dielectric surface of the capacitor element 8 being reduced to a metal when the electrodes 8a of the capacitor element 8 are attached to the connection pads 5a, and thus the capacity of the capacitor element 8 may be kept at a constant value and the adverse effects of power supply noise on the semiconductor element 3 may be completely prevented to ensure normal and steady operation of the semiconductor element 3 over a long period of time.

In addition, since the soldering material 9 has a melting temperature of 300°–500° C., in cases where the semiconductor element 3 is hermetically housed inside the package to assemble a semiconductor device and then connected to wiring conductors of exterior electrical circuit boards by means of reflow solder, there is no risk of the soldering material 9 being softened and melted even in cases where the soldering material 9 is heated by the heat of the reflow solder; as a result the adverse effects of power supply noise on the semiconductor element 3 may be effectively prevented with the capacitor element 8 by electrically connecting the capacitor element 8 having a designated capacity securely to some point along the connection between the power supply electrode and the grounding electrode of the semiconductor element 3.

Here, for the soldering material 9, silver (Ag) is the constituent for both control of the hardness of the soldering material 9 and improvement of corrosion resistance of the soldering material 9; the soldering material 9, when soldered, becomes branched, and many pinholes, voids and nests are formed in cases where silver is present at less than 40.0% by weight, whereas the melting point of the soldering material 9 increases at the proportions exceeding 45.0% by weight.

Accordingly, the amount of silver composing the soldering material 9 is prescribed to be within a range from 40.0 to 45.0% by weight.

Also, indium (In) composing the soldering material 9 is a constituent for both lowering the melting point of the soldering material 9 and improving the wettability of the connection pads 5a and the electrodes 8a of the capacitor element 8 by the soldering material 9; the soldering material 9, when soldered, becomes branched, and many pinholes, voids and nests are formed in cases where indium is present at less than 5.0% by weight, whereas the melting point of the soldering material 9 increases at the proportions exceeding 45.0% by weight. Accordingly, the amount of indium composing the soldering material 9 is prescribed to be within a range from 5.0 to 45.0% by weight.

Also, tin (Sn) composing the soldering material 9 is a constituent for both lowering the melting point of the soldering material 9 and improving the wettability of the connection pads 5a and the electrodes 8a of the capacitor element 8 by the soldering material 9; the soldering material 9, when soldered, becomes branched, and many pinholes, voids and nests are formed in cases where tin is present at less than 15.0% by weight, whereas the melting point of the soldering material 9 increases at the proportions exceeding 55.0% by weight. Accordingly, the amount of tin composing the soldering material 9 is prescribed to be within a range from 15.0 to 55.0% by weight.

Also, copper (Cu) composing the soldering material 9 is a constituent for improving the wettability of the connection pads 5a and the electrodes 8a of the capacitor element 8 by the soldering material 9, and the melting point of the soldering material 9 increases at the proportions exceeding 10.0% by weight. Accordingly, the amount of copper composing the soldering material 9 is prescribed to be within a range of 10.0% by weight or less.

In cases where the soldering material 9 is formed of an alloy consisting of from 40.0 to 42.0% by weight of silver, from 25.0 to 30.0% by weight of indium, from 20.0 to 30.0% by weight of tin, and 5.0% or less by weight of copper, it shows a melting point of 300°–450° C. Even at a temperature greater than the melting point of the soldering material by about 50° C., which enables, generally, good and efficient soldering, the dielectric surface of the capacitor element 8 is not reduced to a metal and is made possible to be soldered. In addition, the outer surface of the soldering material 9 is made smooth with only minute irregularities (bumps and dents), and therefore, moisture or the like is not trapped in the irregularities on the surface of the soldering material 9, thereby essentially preventing the corrosion of the soldering material 9 by the moisture trapped in the surface of the soldering material 9 from occurring. Accordingly, the soldering material 9 is, preferably, formed of an alloy consisting of from 40.0 to 42.0% by weight of silver, from 25.0 to 30.0% by weight of indium, from 20.0 to 30.0% by weight of tin, and 5.0% or less by weight of copper.

As described above, with the package for housing a semiconductor element according to the present invention, a semiconductor element 3 is securely bonded onto the semiconductor element-mounting section 1a of the insulating substrate 1 by means of an adhesive such as glass, resin or soldering material, while the respective electrodes of the semiconductor element 3 are electrically connected to the metallized wiring layers 5 via the bonding wires 6, after which the lid 2 is bonded to the top surface of the insulating substrate 1 by means of a sealant comprising glass, resin, soldering material or the like, and the semiconductor element 3 is hermetically housed inside a container composed of the insulating substrate 1 and the lid 2 to complete a semiconductor device product.

In the case of the package for housing a semiconductor element according to the present invention, since the electrodes of the capacitor element are attached to the connection pads provided on the outer surface of the container by means of a soldering material which is an alloy consisting of from 40.0 to 45.0% by weight of silver, from 5.0 to 45.0% by weight of indium, from 15.0 to 55.0% by weight of tin and 10.0% or less by weight of copper and thus having a melting temperature of 300°–500° C., there is neither risk of the capacitor element being detached from the connection pads when the completed semiconductor device is connected to wiring conductors of exterior electrical circuit boards nor possibility of the dielectric surface of the capacitor element being reduced to a metal to cause change in the capacity and to create a short circuit between the electrodes of the capacitor element when the electrodes of the capacitor element are attached to the connection pads of the container, and therefore a secure connection may be established with the capacitor element having a designated capacity to some point along the connection between the power supply electrode and the grounding electrode of the semiconductor element to completely prevent the adverse effects of power supply noise on the semiconductor element and thus allow normal and steady operation of the semiconductor element over a long period of time.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A package for housing a semiconductor element comprising:

a container having an outer surface and a space for housing a semiconductor element therein, and connection pads connecting to a power supply electrode and a grounding electrode of the semiconductor element, the connection pads being formed on the outer surface of the container, wherein at least one electrode of a capacitor element is attached to at least one of the connection pads by means of a soldering material, the soldering material having a melting temperature of from 300° to 500° C., and wherein the soldering material is formed of an alloy comprising from 40.0 to 45.0% by weight of indium, from 15.0 to 55.0% by weight of tin, and 10.0% or less by weight of copper.

2. A package for housing a semiconductor element comprising:

a container having an outer surface and a space for housing a semiconductor element therein, and connection pads connecting to a power supply electrode and a grounding electrode of the semiconductor element, the connection pads being formed on the outer surface of the container, wherein at least one electrode of a capacitor element is attached to at least one of the connection pads by means of a soldering material, the soldering material having a melting temperature of from 300° to 500° C., and wherein the soldering material is formed of an alloy comprising from 40.0 to 42.0% by weight of silver, from 25.0 to 30.0% by weight of indium, from 20.0 to 30.0% by weight of tin, and 5.0% or less by weight of copper.

3. A package for housing a semiconductor element, comprising:

a container having a space for housing a semiconductor element therein; and connection pads connecting to the power supply electrode of the semiconductor element to be housed, the connection pads being formed on the outer surface of the container, wherein the electrodes of a capacitor element is attached to the connection pads by means of a soldering material and the soldering material is formed of an alloy consisting of from 40.0 to 45.0% by weight of silver, from 5.0 to 45.0% by weight of indium, from 15.0 to 55.0% by weight of tin, and 10.0% or less by weight of copper.

* * * * *